| United States Patent [19] | [11] Patent Number: 4,638,468 |
| Francis | [45] Date of Patent: Jan. 20, 1987 |

[54] POLYMER HYDROPHONE ARRAY WITH MULTILAYER PRINTED CIRCUIT WIRING

[75] Inventor: Samuel A. Francis, Marion, Mass.

[73] Assignee: Raytheon Company, Lexington, Mass.

[21] Appl. No.: 637,664

[22] Filed: Aug. 3, 1984

[51] Int. Cl.$^4$ ............................................. H04R 1/00
[52] U.S. Cl. ................................... 367/153; 367/155; 367/157; 310/318; 310/334
[58] Field of Search ............... 367/153, 155, 157, 135; 310/334, 800, 318

[56] References Cited

U.S. PATENT DOCUMENTS 4,404,489  9/1983  Larson, III et al. ................ 310/334

FOREIGN PATENT DOCUMENTS

0122008  7/1984  Japan .

Primary Examiner—Charles T. Jordan
Assistant Examiner—John W. Eldred
Attorney, Agent, or Firm—Martin M. Santa; Richard M. Sharkansky

[57] ABSTRACT

A composite layered assembly of piezoelectric polymer layers and printed wiring layers are configured so that plated-through holes make electrical connection from the outputs of a plurality of polymer hydrophones formed on one or more polymer layers to a plurality of output conductors on a single plane after each hydrophone output is amplified in its associated amplifier.

8 Claims, 9 Drawing Figures

POLYMER HYDROPHONE ARRAY WITH MULTILAYER PRINTED CIRCUIT WIRING

BACKGROUND OF THE INVENTION

A piezoelectric polymer, typically polyvinylidene flouride (PVDF), and relatively flexible ceramic materials are presently available as hydrophone materials. These materials are being developed for use in large passive hydrophone arrays consisting of hundreds or thousands of sensor elements. The need exists to provide electrical connections to the thin surface electrodes of the piezpoelectric material and to provide an orderly and reliable cabling system to bring the signal from each sensor element to central locations for electronic processing. Further, this cabling system should not introduce acoustic scattering in the frequency bands of interest.

It is, therefore, a primary object of this invention to provide a structure which provides electrical connections to the individual sensor elements which satisfies the preceding requirements.

It is further object of this invention to provide a wiring arrangement which is suitable for production of transducer arrays of these materials which is reliable and suitable for production at low cost.

It is a feature of this invention that the wiring of the hydrophone array is accomplished by adapting the general technology of multi-layer wiring boards which are widely used in the electronics industry.

Other objects and features of the invention will be apparent from the following description of the invention.

SUMMARY OF THE INVENTION

A plurality of planar polymer hydrophones are formed on a single layer of the polymer and are electrically independent of each other. Electrical connection of each of the electrically isolated hydrophones is made to its preamplifier which is located in proximity to the hydrophone. Multiple layers of wiring with selective connection to each other and the hydrophones are used to connect each hydrophone to the input of its respective preamplifier and each preamplifier output to a different output line. The multiple wiring layers are bonded together and holes drilled through the bonded layers by which electrical connection is made to a selected hydrophone and its associated preamplifier and to a predetermined output line. The resulting assembly provides a common ground contact for all the hydrophones and an isolated electrical conductor for each hydrophone provided to a cable at one end of the assembly.

BRIEF DESCRIPTION OF THE DRAWINGS

The aforementioned objects and other features of the invention are explained in the following description taken in conjunction with the accompanying drawings wherein.

DESCRIPTION OF THE PREFERRED EMBODIMENT

Figures 1, 9:
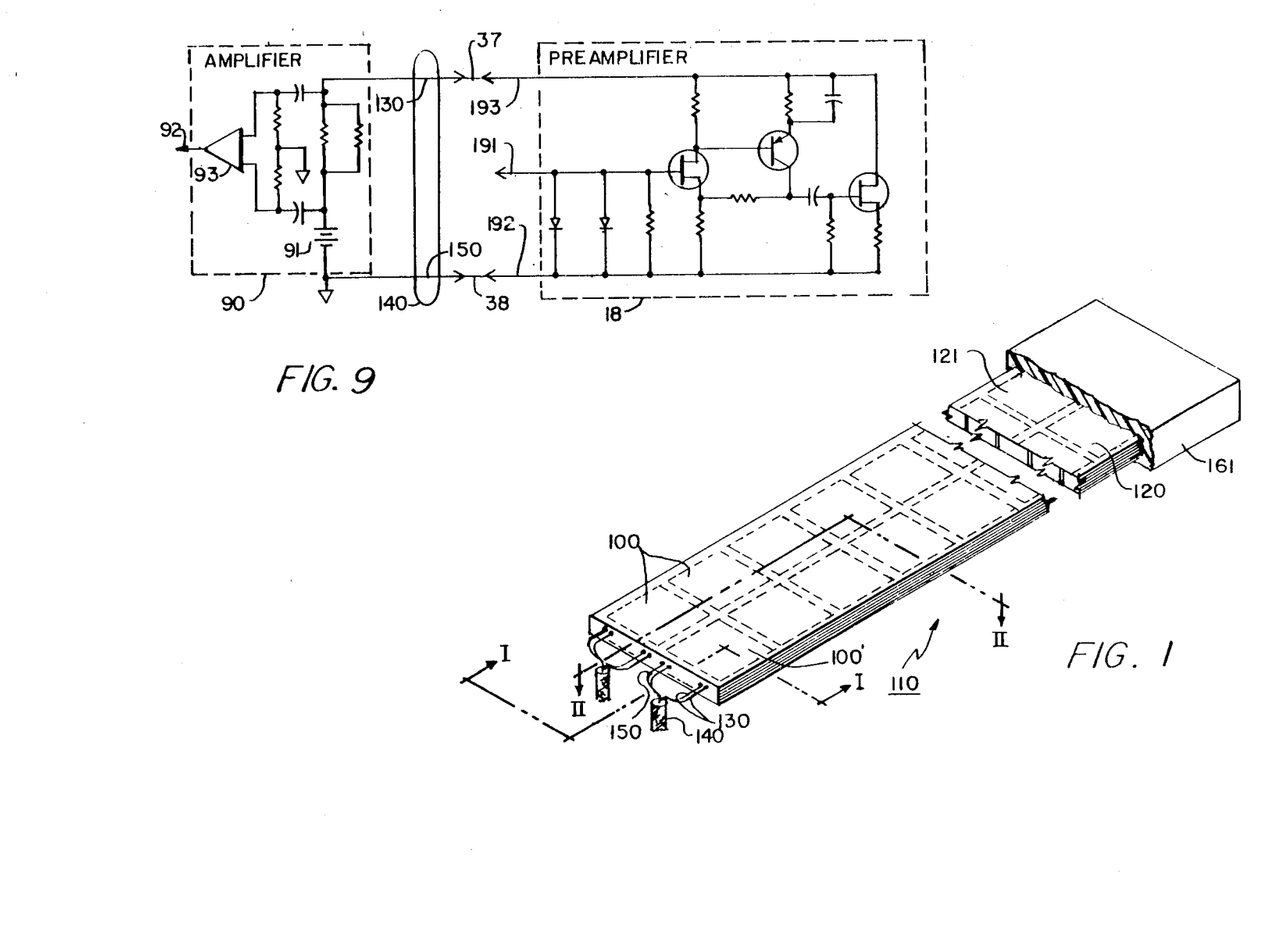
FIG. 1 is an isometric view in partial cross-section of a transducer array made in accordance with this invention.
FIG. 9 shows the electrical wiring diagram of an amplifier and the preamplifier shown in FIG. 2.

Referring to FIG. 1, there is shown an isometric view of transducers 100, shown in phantom, in the multi-layered assembly 110 which includes multi-layer wiring by which each transducer 100 in a row 120, 121 is connected to a conductor 130 of the cable 140. In addition, each transducer 100 of a row 120, 121 has a common electrical ground conductor 150 which also forms a part of the cable 140. A suitable plastic covering 161 seals assembly 110, wires 130, 150, and an end portion of cable 140 from the water environment in which the assembly of transducers is to be used.

Figure 2:
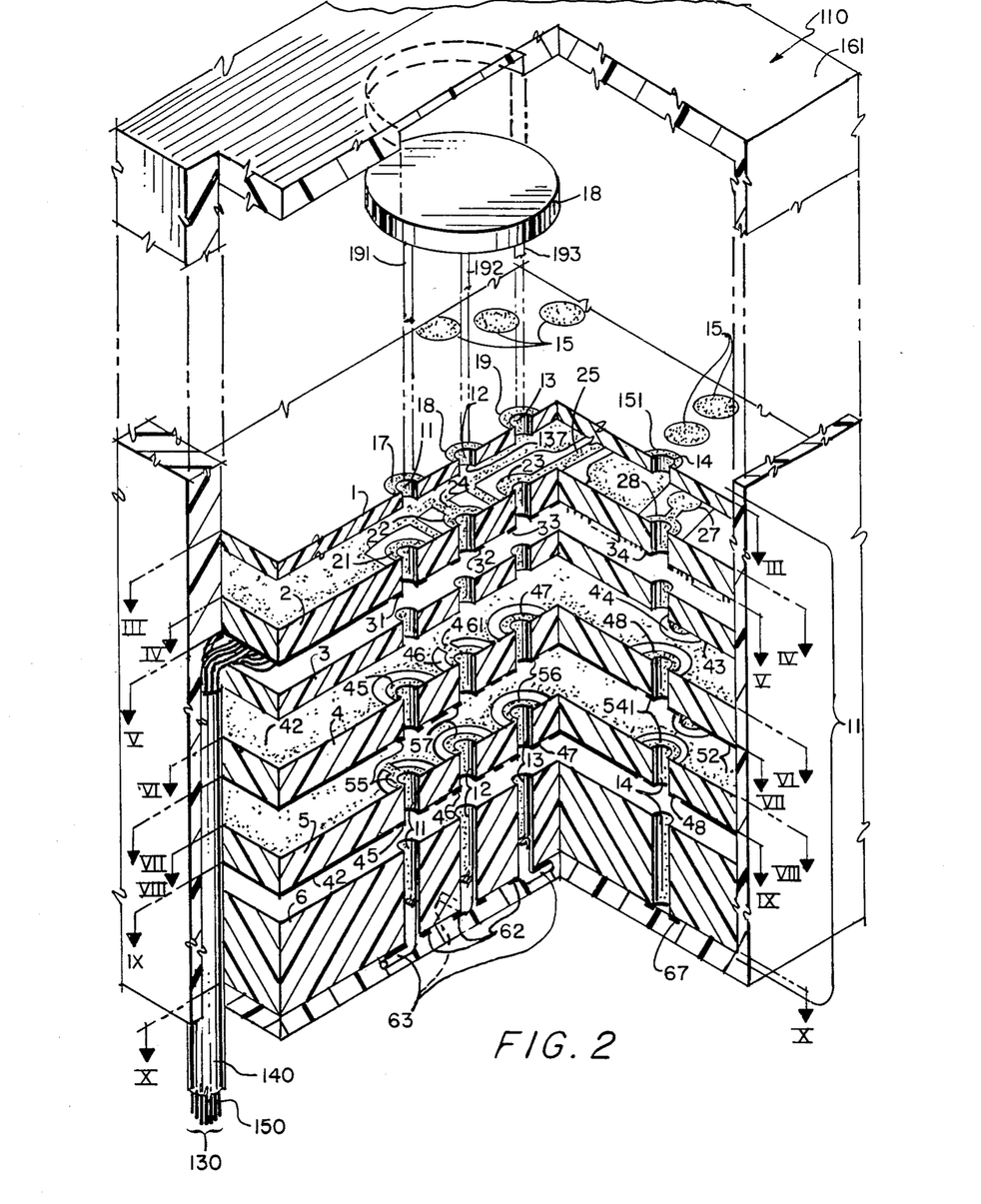
FIG. 2 is an isometric view in a partial cross-section of a single transducer element showing an exploded view of the printed wiring layers.

An isometric cross-sectional view through transducer 100' of FIG. 1, taken along section lines I—I, shows in the enlarged exploded view of FIG. 2 the substrate layers 1, ..., 6 and printed wiring layers 10, 20, ..., 60 forming the multi-layer assembly 110. Each substrate 1, ..., 6 is separated from its adjacent substrate by a wiring layer 10, 20, ..., 60 formed on a substrate in the conventional manner known to those skilled in the art. The layers are selectively interconnected by plated-through-holes 11, 12, 13, 14 which have been drilled through the layers and substrates prior to plating after they have been assembled to form a multi-layered assembly 110 of a plurality of transducers 100.

FIG. 2 also shows a preamplifier 18 with leads 191, 192, 193 which are inserted into and make electrical connection with the plated holes 11, 12, 13, respectively. The plated holes 11, 12, 13 and plated hole 14 extend through all the substrates and cause the conductive pads of each layer 10, ..., 60 through which each hole passes to be electrically conducted. The conductors 191, 192, 193 are bent at their ends 63 prior to being soldered to the pads 62 of the electrically conductive patterned layer 60 of substrate 6 shown in FIG. 8. After the preamplifiers 18 have been electrically connected to the multi-layer assembly 110 at each of the hydrophone locations 100, the assembly 110 is sealed in a waterproof encapsulant 161, typically a plastic normally used for encapsulation, through which the cables 140 pass. Wires 130 of cables 140 provide electrical connection to each of the transducers 100 of rows 120, 121 by connection to wiring layer 30 of FIG. 5 to be described later.

Figure 3:
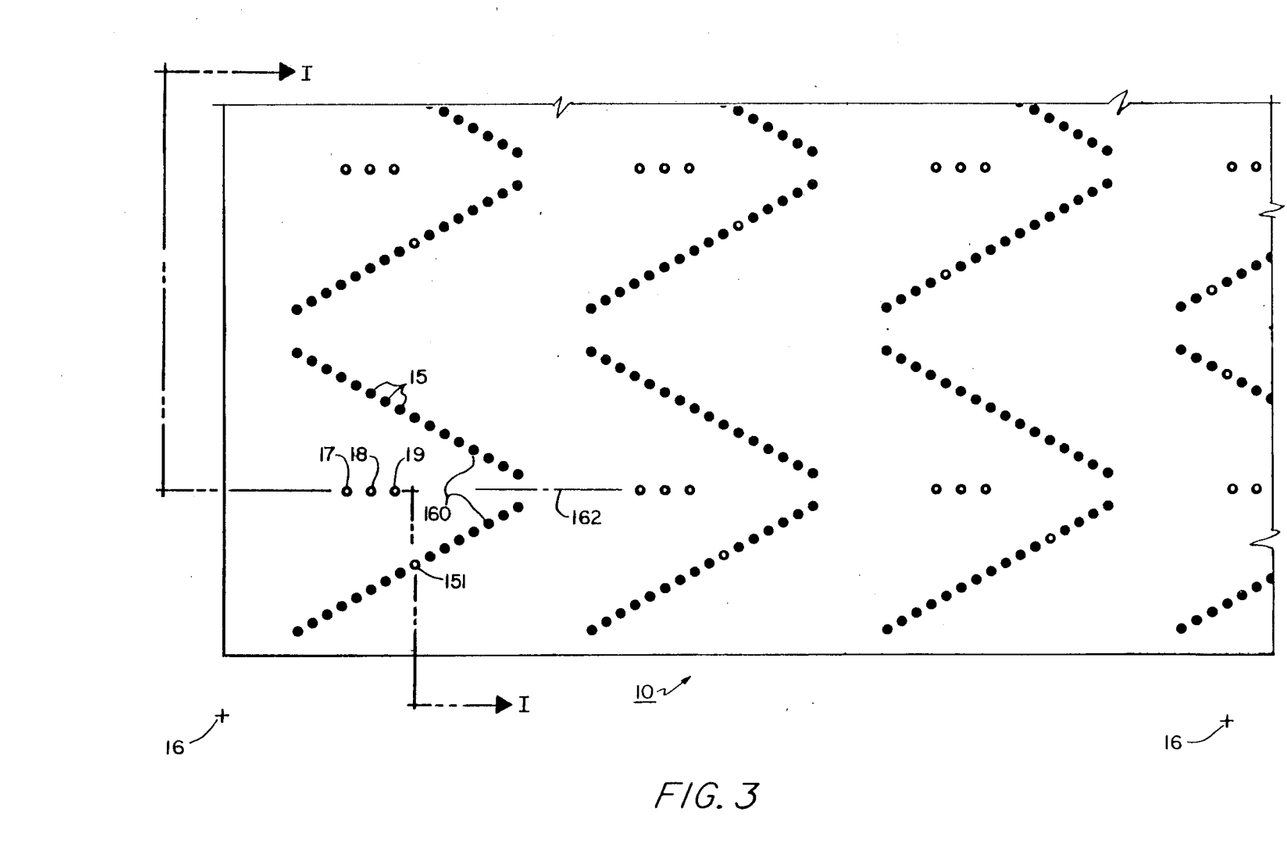
FIGS. 3-8 show the wiring pattern of a section of each of the printed wiring layers prior to their assembly shown in FIG. 2.

Referring now to FIGS. 3-8, there are shown partial plan views bounded by line II—II of FIG. 1 of the printed wiring patterns of the wiring layers 10, 20, ..., 60. Referring first to FIG. 3, there is shown a planar view of layer 10 on substrate 1 taken along the viewing line III—III of FIG. 2. FIG. 3 shows layer 10 to have a plurality of spaced electrically conductive circular regions 15 (hereinafter called pads) arranged in a plurality of chevron patterns 160. In addition, there are groups of three pads 17, 18 and 19 which lay along the center line 162 of chevrons 160. Each chevron lies within the region forming one of the hydrophones 100 shown in FIG. 1. Substrate 1 and its attached layer 10 are shown in partial sectional view in FIG. 2 where the pads 17, 18, 19 and chevron pad 151 are sectioned along section line I—I after being drilled and electroplated to form the plated-through-holes 11, 12, 13 and 14, respectively, as explained subsequently.

Figure 4:
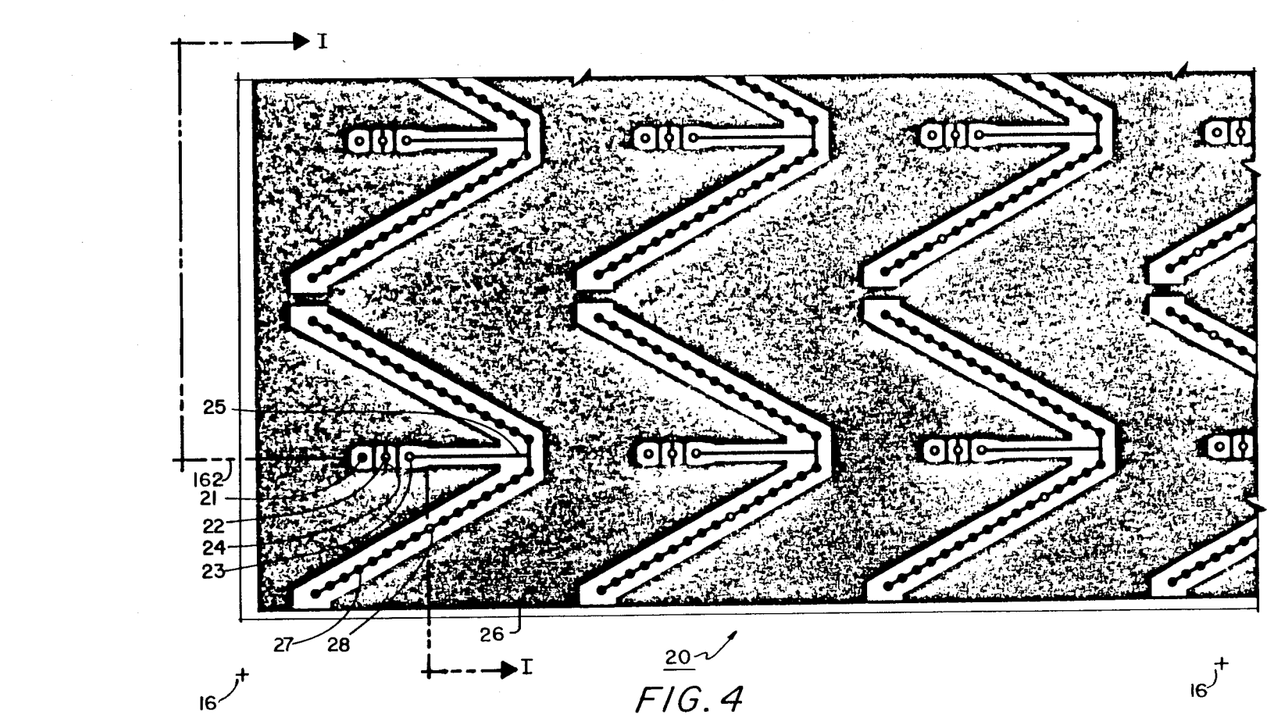
Figure 5:
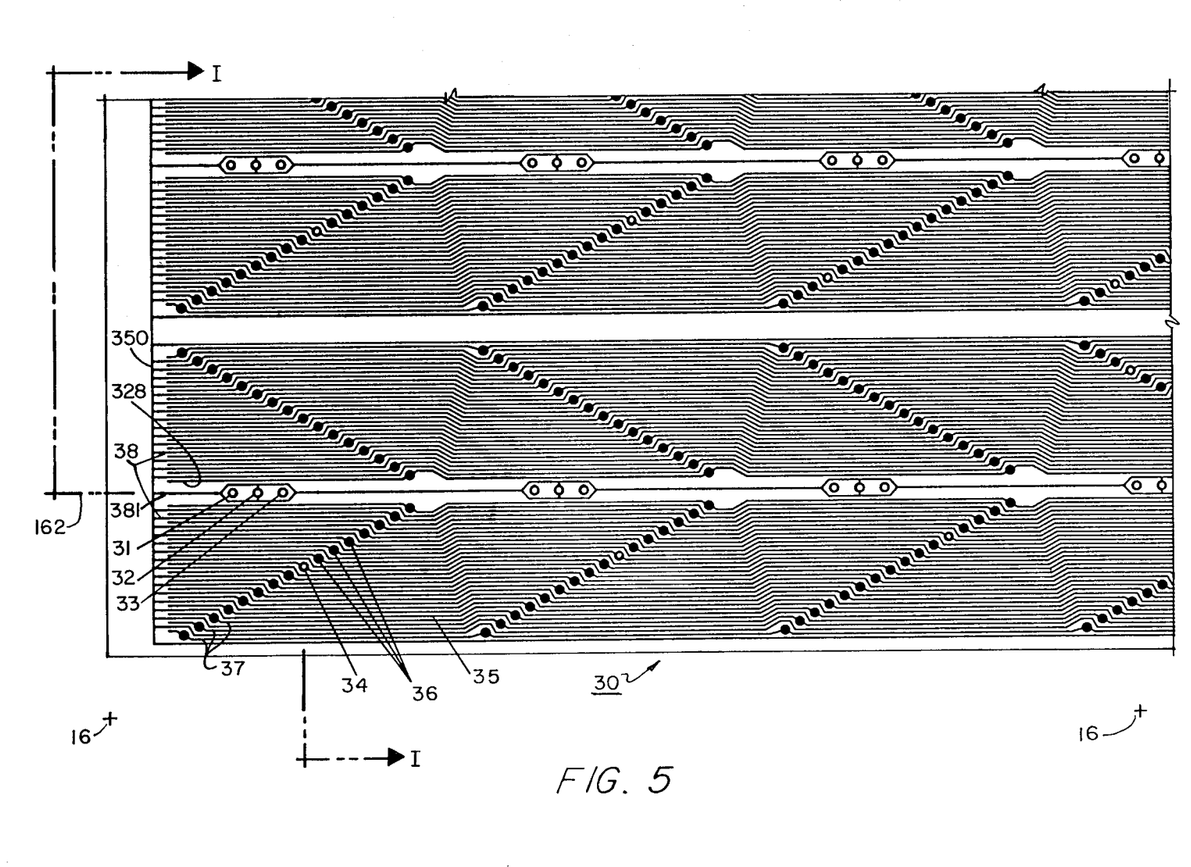

Substrate 2 shown in FIG. 2 has electrically conductive patterned layers 20, 30 on its upper and lower surfaces as shown in FIGS. 4, 5, respectively. The electrically conductive layer 20 on the upper surface is seen in plan view in FIG. 4 viewed from section line IV—IV of FIG. 2. Referring to FIGS. 2 and 4, it is seen that the ground lead 192 of the amplifier 18 is connected to pad 22 which is in electrical connection through connecting link 24 with the extended area electrical conductor 26 which functions as a ground shield for layer 30. The output conductor 193 of amplifier 18 is connected to pad 23 which in turn is connected by link 25 to the pads 28 of the chevron pattern 27.

The wiring layer 30 on the underside of substrate 2 is shown in the planar view of FIG. 5 taken along the section line V—V of FIG. 2, which is a section taken at the interface of the substrate 2 and the wiring layer 30. Layer 30 has a pad 34 through which a hole has been drilled and which is electrically connected by plated hole 14, pad 28, link 25, and plated hole 13 at pad 23 to the output line 193 of the amplifier 18. Pad 34 is part of the printed wire 35 which extends to the end 350 of the layer 30 where electrical connection is made to one of the wires 130 (not shown) of cable 140. Each pad 36 of the chevron together with corresponding pads of other chevrons in the transducer row 120, 121 are connected to a different one of the output lines 37. Each of the output lines 37 is interleaved with a ground conductor 38. Conductors 38,381 are connected together at the ground line 350 of layer 30. Electrical connection is made to the ground lines 38,381 by the ground wire 150 of cable 140. Connection of each of the cable signal wires 130 to the output lines 37 and the ground wire 150 to the ground conductors 38,381 may be made by a suitable connector (not shown). FIG. 5 shows layer 30 pads 31 and 33 to be electrically isolated from the ground conductor 381. Therefore, the input and output leads 191 and 193 of amplifier 18, respectively, are not connected to the wiring of layer 30 of FIG. 5. However, it is noted that pad 32 makes electrical contact with the ground conductor 381 which surrounds and isolates pads 31 and 32 from adjacent signal conductor 328. Hence, the ground wire 192 of amplifier 18 is thereby again connected to the ground wire 150 of cable 140.

Substrate 3 is comprised of a glass fiber reinforced resin only and does not have any printed wiring pattern layer. Substrate 3 therefore functions as a spacer for substrates 2 and 4.

Substrate 4 shown in FIG. 2 is a hydrophone layer wherein the substrate material is a piezoelectric material such as polyvinyldifluoride (PVDF) having its top surface electrodeposited with a conductive layer 40 and its lower surface electrodeposited with a conductive layer 50. Layer 40 is shown in plan view in FIG. 6 taken along section line VI—VI of FIG. 2 as being a continuous layer of electrically conductive material 42 interrupted by electrically isolated conductive pads 43 of the chevrons 44. The pad 46 is in electrical connection with the conductive region 42. Pads 45, 47 and 48 are isolated from region 42. The ground wire 191 of amplifier 18 is connected to the ground plane layer 42 by pad 46. Conductive region 42 acts as a ground shield for the conductive layer 50.

Figure 7:
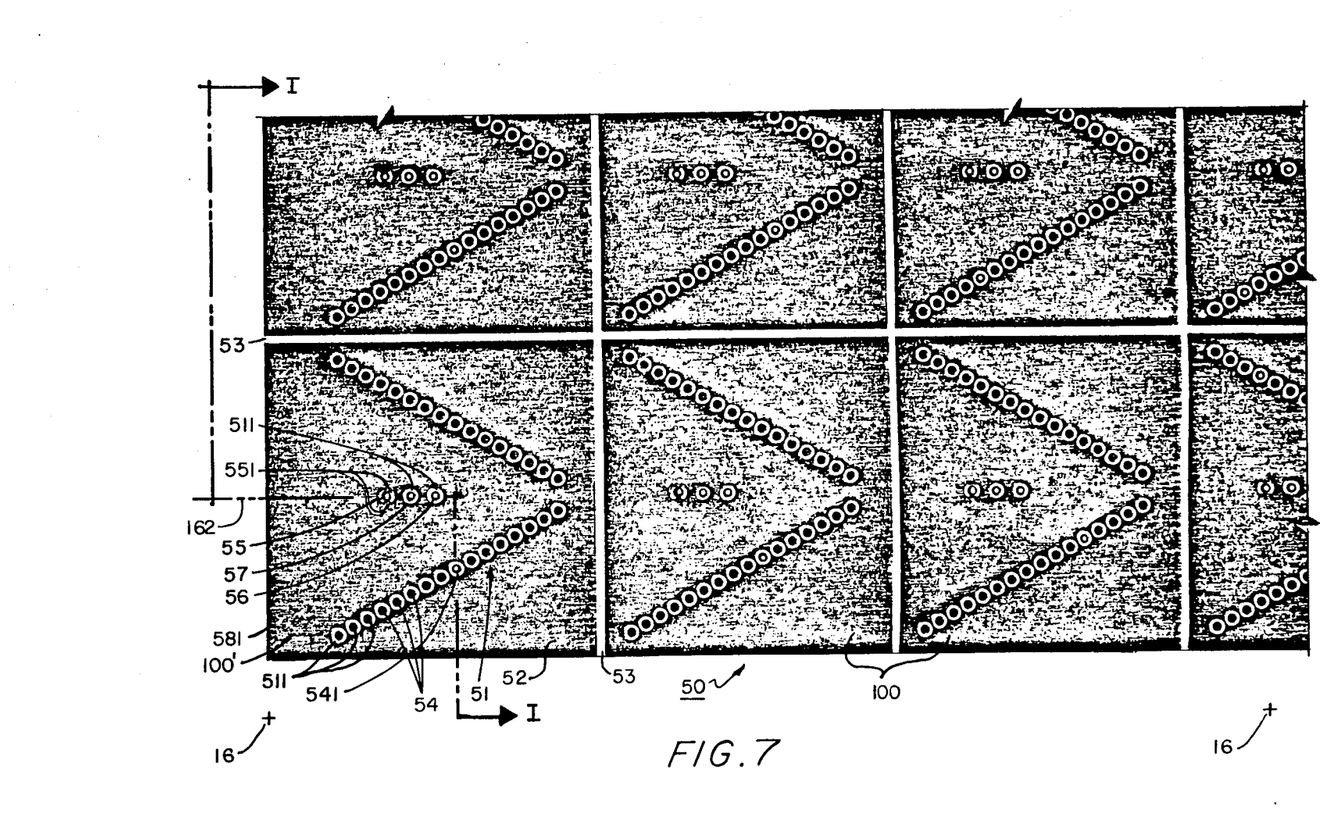

Electrically conductive layer 50 is shown in the plan view of FIG. 7 taken along section line VII—VII of FIG. 2, the section line being immediately above the layer 50. The layer 50 comprises a plurality of conductive regions 52 separated by a plurality of nonconductive regions 53. Each conductive region 52 defines a hydrophone formed under the area of each region 52, by the intervening piezoelectric substrate 40 and the grounded conductive layer 42. Each conductive region 52 has contained within its boundaries a chevron pattern 51 of conductive pads 54 and conductive pads 57, 56 each of which are isolated from the conductive region 52 by a nonconductive circle 511 surrounding each of these pads. Pad 55 is in electrical contact with region 52 by link 551 so that the input conductor 191 of amplifier 18 which penetrates the hole 11 through the center of pad 55 thereby contacts region 52, and thereby connects input 191 of the amplifier 18 to a transducer 100 which is defined by the area of a conduction region 52.

Substrate 5 is of the same substrate material (PVDF) as substrate 4 and has the same electrically conductive pattern layers 40 and 50 defining the hydrophones 100. FIG. 7 also shows a plan view of layer 50 of substrate 5 taken along section line VIII—VIII of FIG. 2. Layers 50 of substrates 4 and 5 are electrically connected by input conductor 191 which is connected to pads 55 of layer 50 by the plated through hole 11. It is noted that because of the choice of the location of section lines VII—VII and VIII—VIII that even though the layers 50 of substrates 4 and 5 face each other, only the one FIG. 7 need be used to correctly portray the hole positions in the chevron pad pattern 54 of both layers 50.

Figure 6:
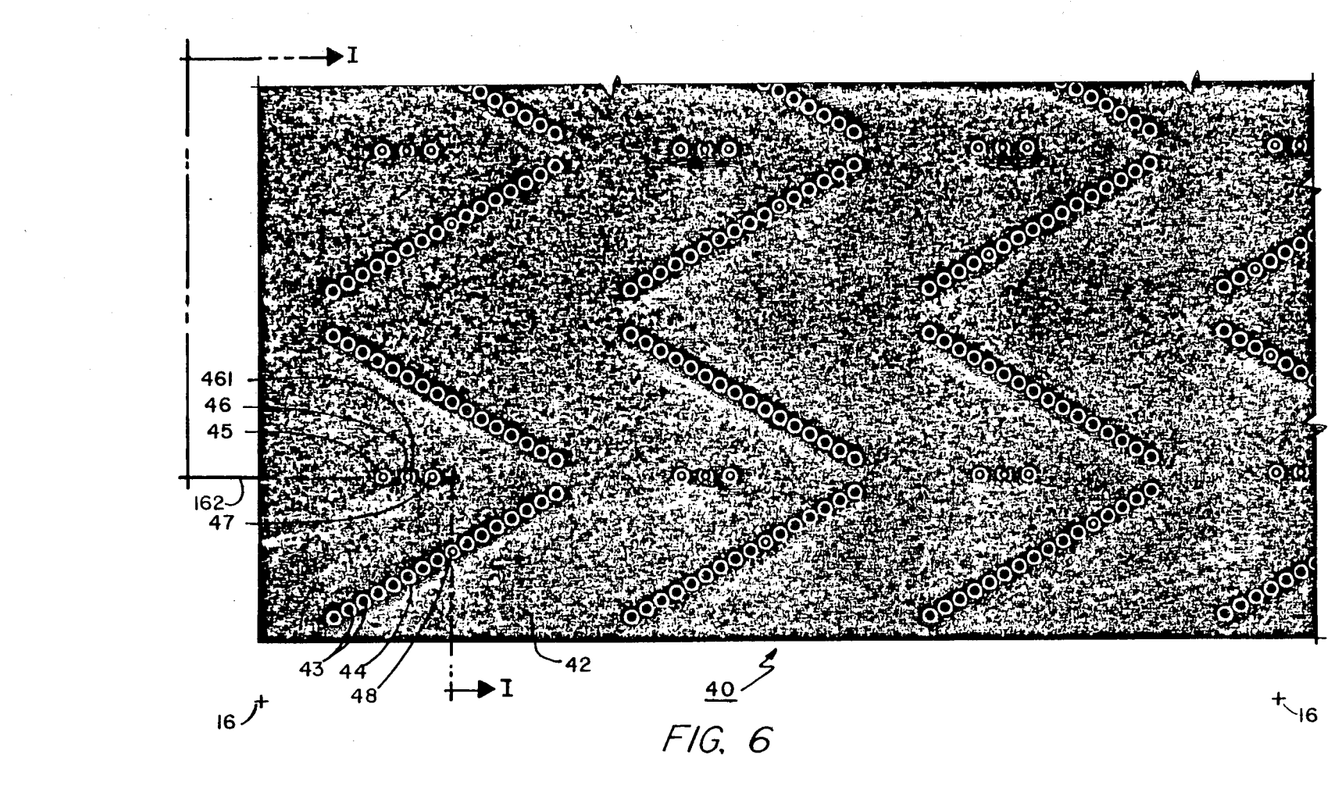

Substrate 5 has a conductive layer 40 shown in FIG. 6 on its bottom side as seen along section line IX—IX of FIG. 2 which provides a view looking down at the interface of layer 40 and substrate 5. Layer 40 on substrate 5 serves the same function as the layer 40 on substrate 4, namely to provide an electrode for the substrate 5 PVDF material which shields the inner electrode 50 of the same substrate. Layers 40 of substrates 4 and 5 are electrically connected by the ground conductor 192 which is connected to pads 46 by the plated through hole 12. FIG. 6 correctly presents the mirror-image layers 40 of both substrates 4 and 5 because of the locations of section lines VI—VI and IX—IX relative to the layers 40.

Figure 8:
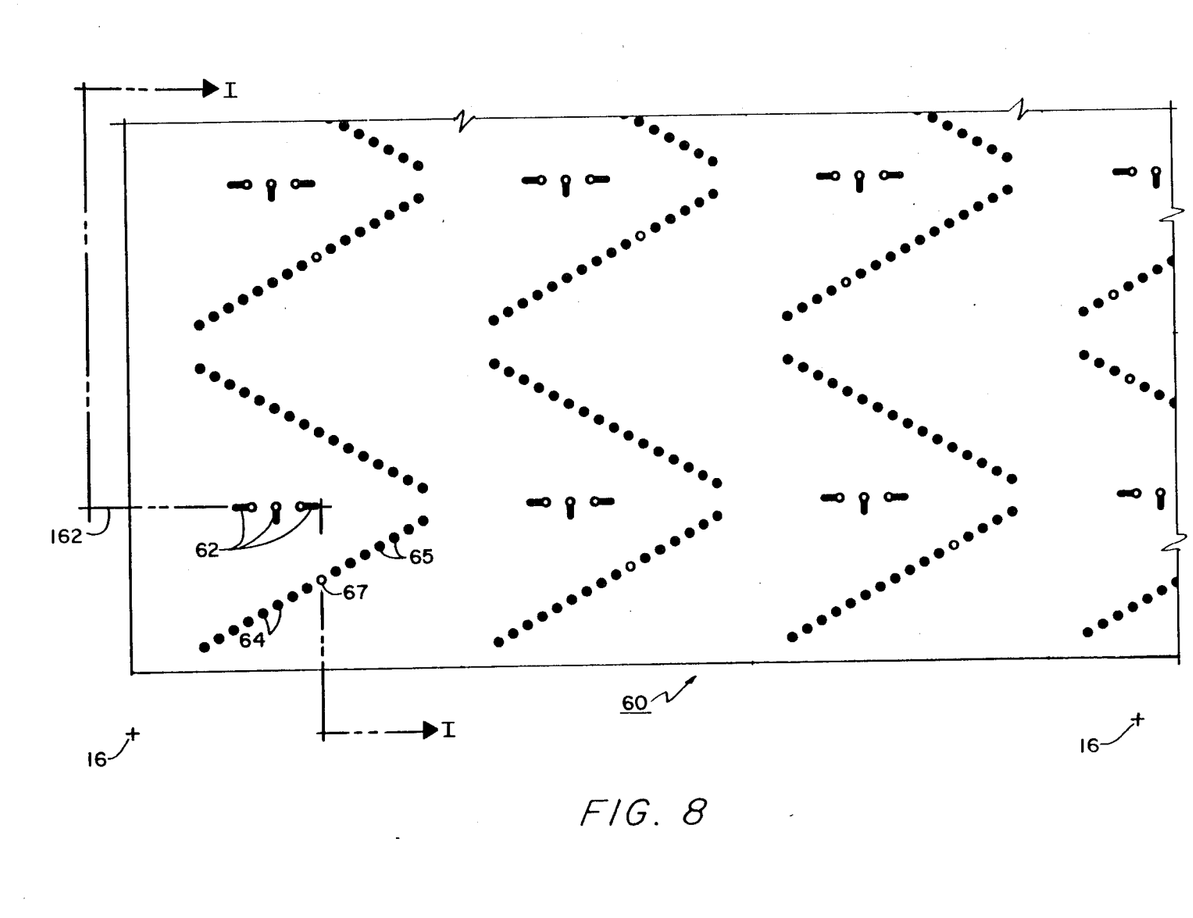

Substrate 6 has a conductive patterned layer 60 deposited to its underside. FIG. 8 shows layer 60 taken along the section line X—X which is at the interface of layer 60 and the substrate 6. The conductive patterned layer 60 comprises conductive elongated pads 62 to which the bent ends 163 of conductors 191, 192 and 193 of amplifier 18 are solder connected. The elongated shape of the conducting regions 62 provides a broader area to which the bent ends 63 of the amplifier 18 conductors are soldered and make electrical contact. Pads 64 of chevron 65 are electrically isolated and serve the purpose of ascertaining whether a hole drilled through one of the pads, such as pad 67 of FIG. 2, is centered on the pads of the layers intervening layers 10 and 60.

The conductive layers 10, . . . , 60 shown in FIGS. 3-8 are shown as they appear when viewed along their respective section lines after incorporation into a completed assembly 11 of transducers 100 with holes in the center of selected conducting pads of each layer. These holes are shown on the FIGS. in order to illustrate the conducting layers as they exist in a completed assembly shown in part in the exploded view of FIG. 2. However, prior to their assembly and fabrication into the completed assembly shown in FIG. 1 and in partial sectional view in FIG. 2, there are no holes in any of the pads of each layer and its substrate. The layers and the substrates on which they are formed are assembled in the order and orientation shown in the exploded view of FIG. 2. In order to aid in the proper alignment of layers 1–8, fiducial marks 16 are provided on each of the conducting layers. Prior to assembly, holes are drilled through the marks 16 of each layer and the substrates 1–6 with their respective attached conductive patterned layers 10, ..., 60 are assembled with the drilled holes of each of the substrates through marks 16 held in alignment by rods thereby assuring that the conductive pads of each of the layers 10, ..., 60 are in alignment with one another. The substrates are bonded to one another by applying between the layered substrates 1–6 a suitable epoxy, typically the epoxy resin used in the substrates, which is not yet cured but which contains a curing agent. By the application of a suitable pressure and temperature to a press between which the assembled substrates are placed, the epoxy is expressed from between the layered substrates 1–6. Preferably only one substrate is bonded at a time to one or more previously bonded substrates. The temperature is below that which would cause depolarization of the PVDF material which typically occurs below 140° F. The pressure applied is of a magnitude which leaves a thin coating of epoxy remaining between the substrates in order to prevent voids between the substrates. The presence of voids is undesired because the plating solution which is subsequently used in the fabrication of the plated-through-holes of the hydrophone assembly to selectively connect layers 10, ..., 60 may fill the voids and cause electrical connection to portions of the wiring which is not desired.

Assuming that the suitable pressure and temperature has been applied and that the epoxy has been cured for the required time to cause it to harden and thereby bond substrates 1–6 to one another, the bonded substrates are ready for the next step in the fabrication process. A plurality of transducers 100 were arranged to form two rows of transducers of an array and each of the transducers of a row is to have an output conductor electrically isolated from other transducer output conductors in the same row of the array 11. The bonded layers 1–6 have holes drilled through pads 17, 18, 19 of substrate 1 and through all the corresponding aligned pads of substrates 2–6 thereby providing holes 11, 12, 13 terminating at the center of the pads 62 of the bottom substrate 6. Each chevron of a row has only one hole drilled through all the substrates and the hole location for each hydrophone 100 of a row is different from the hole locations on the other chevrons of that row for the other hydrophones. Reference to FIGS. 3–8 shows that the hole drilled in one pad of each chevron 160 of layer 10 is also drilled through corresponding aligned pads of each of the chevrons of the remaining layers 20, ..., 60. Typically, the pads 64 of the chevron 65 have one pad 67 drilled through all the correspondingly located pads on the other layers, pad 151 of layer 10, for example.

The next step in the process is to use conventional plated-hole technology, well known to those skilled in the art, to electrically connect each of the drilled pads of each layer with the corresponding drilled pad of the other layers. A few plated holes 11–14 are shown in the exploded sectional view of FIG. 2. Referring to FIG. 2, the electroplated hole 11 causes electrically conductive region 52 of hydrophone active material (PVDF) layers 50 of substrates 4 and 5 to be connected to the input conductor 191 of amplifier 18. Plating through the holes connects the pad 55 of the voltage producing conductive layer 52 of each of the hydrophones 100 to the input lead 191 of its respective amplifier 18.

The ground lead 192 of amplifier 18 is connected by means of the plated-hole 12 to the electrically conductive ground layer 26 of the layer 20 via the connecting link 24 of pad 22. Lead 192 is also connected by plated hole 12 to the conductive ground layers 42 of substrates 4 and 5 by link 461 and pad 46.

The output lead 193 of amplifier 18 is connected by the plated-hole 13 to the pad 23 of the conductive layer 20 of substrate 2 of FIG. 4. Pad 23 is connected by the conductive link 25 to the chevron 27 of layer 20. One of the pads 28 of the chevron 27 makes connection with a pad 34 of the plurality of chevron pads 36 of conductive layer 30 of FIG. 5 through the plated-hole 14. The pad 34 is connected to one output line 35 of the plurality of output lines 37. Line 35 is in turn connected to one of the wires 130 of the cable 140 shown in FIG. 2. The connection of wires 130 to the lines 37 may be made by a suitable connector or by a permanent connection, such as by solder. The ground conductors 38 interleaved with the output conductors 37 are connected to the ground wire 150 of cable 140 by the same connector means. The ground conductors 38 electrically isolate the output conductors 37 from each other and thereby prevent crosstalk. Pad 32 is connected to a ground conductor 38 and also to the ground lead 192 of amplifier 18.

Substrates 1, 2, 3, and 6 are typically glass reinforced (glass fiber) epoxy resin (commercially available material designated as G10 is suitable) to which a layer of copper has been laminated on at least one side by techniques known to those skilled in the art. Other substrate materials may be used. Substrate 3 has no copper layer in this embodiment. An alternate form of construction is to place the wiring layer 30 on substrate 3 instead of on substrate 2. Substrates 4 and 5, which form the piezoelectric layers, are preferably of polarized PVDF material which have a layer of copper deposited on both sides and which is commercially available in that form. Substrates 4 and 5 may also be made of other suitable piezoelectric materials such as powdered ceramic and rubber mixture in sheet form with conductive surfaces which is also commercially available. Prior to the assembly of substrates 1, ..., 6, the copper layer or layers on each substrate are selectively etched by conventional etching techniques to provide the conductive layer patterns of FIGS. 3–8. The thickness of the copper is typically 0.0028 inches.

The thickness of substrates 1, ..., 6 are typically 0.020, 0.020, 0.020, 0.023, 0.023, and 0.0625 inches, respectively. These thicknesses and the physical properties of the resin and PVDF layers cause the neutral plane of bending to occur at approximately the plane between the PVDF layers thereby causing each PVDF layer to produce equal and opposite polarity voltages in response to bending forces on the assembly 110. Since the PVDF piezoelectric substrates are electrically connected in parallel, voltages produced by bending are cancelled and do not appear on lead 191 of amplifier 18. The thickness of the epoxy which acts as the adhesive bond between substrates is normally 0.002 inches.

The conductive pads of the layers are typically 0.10 inches in diameter with the drilled hole being typically 0.05 inches in diameter. The thickness of the copper of the plated-through-hole is typically 0.003 inches. The diameter of the drilled pads provides reasonable tolerance in the drilling operation and registration of the pads of the layers. Larger pads could be used if the density of the lines of wiring layer 30 is reduced by having fewer hydrophones in a row.

Referring now to FIG. 9, an amplifier 18 is shown connected to cable 140 by its signal wire 130 and a ground wire 150. Conductors 191, 192, 193 of amplifier 18 are connected to the hydrophone 100 as explained earlier. Output conductor 193 is connected through a conductor 37 and signal wire 130 to a power source 91 of signal amplifier 90 having an output 92. The hydrophone signal on amplifier 18 input conductor 191 causes the conductance of amplifier 18 between conductors 192 and 193 to vary in accordance with the signal. The charge in current produced by source 91 is detected and amplified by amplifier 93 to provide an output signal 92 corresponding to the signal on conductor 191 produced by a hydrophone 100.

It is to be understood that the above-described embodiment of the invention is illustrative only and that modifications thereof may occur to those skilled in the art. Accordingly, it is desired that this invention is not to be limited to the embodiment disclosed herein but is to be limited only as defined by the appended claims.

What is claimed is:

1. A hydrophone array comprising:
   a layer of piezoelectric polymer having a plurality of discrete first areas of electrically conductive film attached to one side of said layer and a second area of conductive film opposite said plurality of areas on the other side of said layer, each discrete area forming a hydrophone;
   said plurality of discrete areas being arranged in a row;
   a plurality of printed wiring layers in contact with each other and at least one side of said polymer layer;
   one of said printed wiring layers having a plurality of parallel first output conductors parallel to said row and electrically isolated from each other;
   a different one of said plurality of printed wiring layers having a plurality of second conductors, one under each area, transverse to said row;
   a plurality of amplifying means, each having an input and an output;
   a plurality of plated-through holes;
   said holes making a plurality of selective electrical connections of one of said first area conductive films to the input of its associated said amplifier means, a plurality of selective electrical connections of one of said parallel first conductors to one of said plurality of second conductors connected to the output of said amplifying means, and selective electrical connections of said second area conductive film to a different one of said parallel first conductors;
   whereby said plated-through holes provide electrical connection between each of said hydrophones of the array and a respective one of said parallel first output conductors.

2. A hydrophone array comprising:
   a first, second, third and fourth substrate;
   each of said substrates having on at least one surface a plurality of chevron patterns with each chevron pattern in a row having its axis of symmetry on a common axis;
   each chevron pattern comprising a plurality of electrically conductive pads;
   a first, second, and third electrically conductive pad within each chevron and on said common axis;
   corresponding chevron pads and corresponding said first, second, and third pads of all substrates being in vertical alignment;
   the chevron pads and said third pad of said first substrate being electrically connected;
   a first electrically conductive layer on said first substrate electrically isolated from the chevron pads and first and third pads and electrically connected to said second pad;
   said second substrate having a first plurality of parallel electrically conductive lines parallel to said common axis, each line electrically connected only to the corresponding pads of the plurality of chevrons on said second substrate;
   said third and fourth substrates each being a piezoelectric material and each having a second electrically conductive layer on one side, said second layer being electrically connected to said second pad;
   each third and fourth substrate having a fourth electrically conductive layer on its other side comprising a plurality of electrically conductive regions electrically isolated from each other and each connected with one first pad to thereby form a plurality of transducer elements;
   an assembly of said first, second, third, and fourth substrates in that order with the fourth conductive layers of said third and fourth substrates proximate to each other;
   each of said first, second, and third pads and a selected pad of said chevrons and said assembled substrates thereunder having a hole therethrough, said selected pad of each chevron being different for each chevron of a row;
   a plurality of electrical conductors;
   each conductor in each of said holes being in electrical connection with the pad surrounding said hole;
   an amplifying means;
   one of said conductors connected to said fourth layer being connected to the input of said amplifying means;
   each of said conductors which are connected to a chevron pad being connected to a different one of said plurality of parallel electrically conductive lines;
   said amplifying means having its output connected to the conductor connected to said third pad and thereby from the chevron of said first layer to a chevron pad connected to an output line; and,
   said second pad of each layer being connected to one of said parallel conductive lines lying on the common axis and to the conductive layer of said first substrate and the third electrically cohductive layer of said third and fourth substrates.

3. The hydrophone array of claim 2 comprising in addition:
   a second plurality of parallel electrically conductive lines of said second substrate, said second lines alternating with said first lines and connected together at an end with said line on said common axis.

4. The array of claim 2 comprising in addition:
   a fifth and sixth substrates having said plurality of chevron patterns of conductive pads and of said first, second, and third pads;

said fifth and sixth substrates being assembled with and in contact with said first and fourth substrates, respectively;

the conductive pads of said fifth and sixth having holes corresponding to the remaining substrates and having electric conductors extending through and in contact with said pads; and, a plastic enclosure over said assembly of said substrate and said amplifying means.

5. The array of claim 2 wherein:

said first and second substrates are electrical insulating materials.

6. The array of claim 4 wherein:

said first, second, fifth, and sixth substrates are electrical insulating materials.

7. A hydrophone array comprising:

a first substrate having a first plurality of electrically conductive pads spaced from and elecrically isolated from each other and arranged in a first chevron pad pattern having an axis of symmetry and a second plurality of electrically conductive pads on said axis;

a plurality of said first chevron pad patterns and a plurality of said second plurality of pads;

said first chevron pad patterns being spaced from each other and having their axes of symmetry along a common axis as are each of said second plurality of pads;

a second substrate having a third plurality of conductive pads arranged in a plurality of chevron patterns corresponding to said plurality of first chevron pad patterns;

a fourth plurality of electrically conductive pads corresponding to said second plurality of conductive pads said third plurality of conductive pads being electrically connected to each other and to a first of said fourth plurality of pads;

a first conductive layer on said second substrate;

a second pad of said fourth plurality being electrically connected to said first conductive layer;

a third substrate having a plurality of parallel electrically conductive lines;

a fifth plurality of conductive pads corresponding to said first chevron pattern;

each line intersecting those pads of said fifth plurality of conductive pads located at corresponding positions of said chevron pad patterns, pads on said third substrate corresponding to said second pad being connected to a line corresponding to said axis;

a fourth and fifth piezoelectric substrates each having a second elecrically conductive layer on one surface and having a chevron pattern of electrically conductive pads each electrically isolated from said second conductive layer, a fifth plurality of electrically conductive pads corresponding to said second plurality, one pad of said fifth plurality corresponding to said second pad of said fourth plurality being in electrical contact with said second conductive layer, the other pads of said fifth plurality of pads being electrically isolated from said second conductive layer;

said fourth and fifth substrates having a second surface which has a sixth plurality of conductive pads in chevron patterns corresponding to said first plurality of dots and a seventh plurality of conductive pads at locations corresponding to said second plurality of conductive pads, a third electrically conductive layer surrounding each of said sixth and seventh plurality of conductive pads and electrically isolated therefrom, said third conductive layer comprising regions electrically isolated from each other of said third regions;

one of said seventh plurality of conductive pads corresponding in location to the third of the second plurality of pads, being electrically connected to the third region surrounding it;

said fourth and fifth substrates each having their second surfaces adjacent each other;

said first through fifth substrates being assembled in that order with all first, second and third pads and chevron pad patterns in registration;

said first, second, and third pads and a pad of each chevron of each substrate having a hole through the pads and their underlying substrates; and, said pads of each hole being electrically connected to their corresponding pads by a peripheral portion of each of said pads.

8. The array of claim 7 wherein:

said second plurality of pads are within the area encompassed by said chevron.

* * * * *